United States Patent [19]

Baron

[11] 3,837,924

[45] Sept. 24, 1974

[54] SOLAR ARRAY

[75] Inventor: Wilfred R. Baron, Palos Verdes Peninsula, Calif.

[73] Assignee: TRW, Inc., Redondo Beach, Calif.

[22] Filed: July 20, 1973

[21] Appl. No.: 381,105

Related U.S. Application Data

[63] Continuation of Ser. No. 148,386, June 1, 1971, abandoned.

[52] U.S. Cl. .................................... 136/89, 29/572
[51] Int. Cl. ........................................ H01l 15/02
[58] Field of Search ....................... 148/386; 136/89

[56] References Cited

UNITED STATES PATENTS

| | | | |
|---|---|---|---|
| 2,989,575 | 6/1961 | Wallace, Jr. | 136/89 |
| 3,346,419 | 10/1967 | Forehand et al. | 136/89 |
| 3,454,774 | 7/1909 | Wizenick | 136/89 X |
| 3,502,507 | 3/1970 | Mann | 136/89 |
| 3,575,721 | 4/1971 | Mann | 136/89 |
| 3,620,847 | 11/1971 | Wise | 136/89 |

*Primary Examiner*—A. B. Curtis
*Attorney, Agent, or Firm*—Daniel T. Anderson; Donald R. Nyhagen; Jerry A. Dinardo

[57] ABSTRACT

A solar array and method of its fabrication wherein the solar cells are attached to a supporting substrate and electrically joined by interconnects having end terminals attached to the cell contacts with predetermined center distances between adjacent cell-substrate attachment points and the terminal attachment points of each interconnect, such that during thermal cycling of the solar array, each interconnect and the portion of the substrate between the adjacent cell-substrate attachment points undergo substantially equal thermal expansion and contraction so as to virtually eliminate stressing and flexing of the interconnects and thereby eliminate the need for flexibility in and avoid fatigue failure of the interconnects.

3 Claims, 3 Drawing Figures

Wilfred R. Baron
INVENTOR.
BY
ATTORNEY

PATENTED SEP 24 1974 3,837,924

SHEET 2 OF 2

Wilfred R. Baron
INVENTOR.

BY Donald R. Nyhagen
ATTORNEY

SOLAR ARRAY

This is a continuation of application Ser. No. 148,386 filed June 1, 1971, now abandoned.

The invention herein described was made in the course of or under a contract or subcontract thereunder, (or grant) with the Department of the Air Force.

BACKGROUND OF THE INVENTION

1. Field of the Invention

This invention relates generally to solar arrays and more particularly to improvements in solar arrays of the kind having solar cells attached to a supporting substrate and electrically joined by interconnects.

2. Prior Art

A variety of solar arrays have been devised for space satellites and other space applications. A typical solar array has a large number of solar cells attached to a supporting substrate or the like and arranged side by side in parallel rows. The cells in each row are connected in electrical series and the several cell rows are connected in electrical parallel to provide a series-parallel cell matrix. Each cell has a light sensitive front side with a collector contact along one edge and a rear conductive surface providing a base contact.

The solar cells in each cell row may be disposed in overlapping relation, or the several cells in the array may be disposed in coplanar edge to edge relation. U.S. Pat. Nos. 3,340,096 and 3,459,597 disclose solar arrays with overlapping cells. U.S. Pat. Nos. 2,989,575; 3,005,862; 3,094,439; and 3,232,795 disclose solar arrays with coplanar solar cells In its normal operational environment, a solar array is generally exposed to extreme temperatures and temperature changes, or thermal cycling. Such thermal cycling causes thermal expansion and contraction of the supporting substrate and, as a consequence, relative movement of the solar cells toward and away from one another. In order to accommodate this relative cell movement, most existing solar arrays employ flexible electrical connections known as flexible interconnects to electrically join adjacent cells.

Such a flexible interconnect has terminal portions which are electrically and mechanically attached to adjacent cells and an intervening central portion or bend which is flexible to permit relative movement of the terminal portions toward and away from one another. Each interconnect in a series cell row of a solar array extends between and has its terminal portions attached to the front collector contact of one solar cell and the base contact of an adjacent cell so as to connect the cells in electrical series. Each interconnect for two adjacent cell rows extends between and has its terminal portions attached to the contacts of adjacent cells in adjacent cell rows in such a way as to connect the rows in electrical parallel.

The use of flexible cell interconnects to accommodate thermal cycling of a solar array has one serious disadvantage which the present invention overcomes. This disadvantage resides in the fact that in the course of a normal space mission, the interconnects are subjected to a large number of high cyclic stresses which frequently cause fatigue failure of the interconnects. In this regard, it is significant to note that cyclic stressing of the interconnects results from the fact that the center distance between the attachment points of each interconnect to its adjacent solar cells is substantially less than the center distance between the attachment points of the cells to the supporting substrate. As a consequence, the solar array substrate and interconnects undergo substantial differential thermal expansion and contraction during thermal cycling. Such differential expansion and contraction subjects the interconnect to large stress which, combined with the cyclic nature of the stress, often causes fatigue failure of the interconnect.

SUMMARY OF THE INVENTION

The present solar array is uniquely constructed to minimize, if not virtually eliminate, cyclic stressing of the cell interconnects and thereby prevent fatigue failure of the interconnects. This is accomplished by making each interconnect of such a length that the center spacing between its attachment points to the adjacent solar cells is related to the center spacing between the attachment points of the cells to the supporting substrate and to the coefficients of thermal expansion of the interconnect and substrate materials in a manner which results in substantial equal thermal expansion and contraction of the interconnect and substrate within the regions between the respective attachment points. Cyclic stressing and flexing of the interconnect is thus substantially reduced or eliminated. Moreover, the need for flexibility in the interconnects to accommodate thermal expansion and contraction of the substrate is eliminated.

DESCRIPTION OF THE PREFERRED EMBODIMENTS

Figure 1:
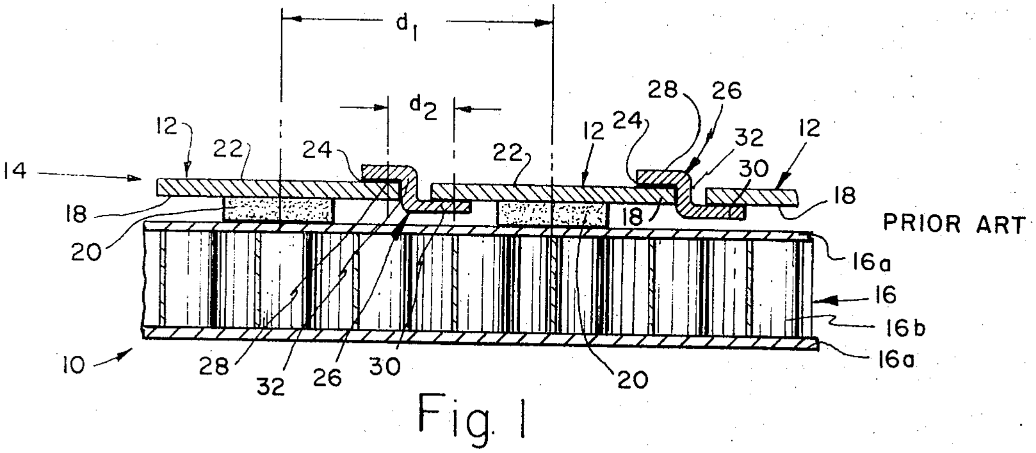
FIG. 1 is a section through a prior art solar array with solar cell interconnects.

Reference is made first to FIG. 1 illustrating a portion of a typical conventional solar array 10. The solar cells 12 of the array are arranged in parallel rows 14 (only as shown) over one surface of a supporting substrate 16. The base surfaces 18 of the cells are bonded to the substrate by epoxy cement 20 or the like. Each cell has an upper or front surface with a light sensitive portion 22 and a collector contact 24 along one edge of the cell. The base surface 18 of each cell is electrically conductive and provides a base contact. In the particular solar array shown, the solar cells 12 are arranged in coplanar edge to edge relation. The dimensions of the cells and substrate and clearance between cells has been exaggerated for clarity. The substrate 16 is a honeycomb panel including two outer facing sheets **16*a* of aluminum or other suitable material and a central honeycomb core 16*b*.**

The solar cells 12 in each cell row 14 are arranged with their front collector contacts 24 along the edges of the cells nearest one end of the row, i.e., the right end of the row in FIG. 1. The adjacent cells are electrically connected by flexible interconnects 26. Each interconnect extends between the front collector contact 24 of one cell and the base contact 18 of the adjacent right-hand cell. The several cells in each cell row are thereby connected in electrical series. Each interconnect 26 is constructed of flexible metal, such as aluminum, and has terminal portions 28, 30 and an intervening flexible bend 32. The terminal portions 28, 30 of each interconnect are soldered or otherwise firmly electrically joined to the collector and base contacts, respectively, of the adjacent cells. The flexible bend of each interconnect extends between the adjacent cell edges, transverse to the cells.

When in its normal operating environment of outer space, the solar array is exposed to extreme temperatures and cyclic temperature changes, or thermal cycling. These temperature fluctuations cause thermal expansion and contraction of the substrate 16 and interconnects 26. Thermal expansion and contraction of the substrate produces relative movement of the adjacent solar cells 12 toward and away from one another, thereby increasing and decreasing the center distance $d_1$ between the attachment points of adjacent cells to the substrate 16. Thermal expansion and contraction of the interconnects increases and decreases the interconnect length $d_2$ between centers of its attachment points to the adjacent cell contacts. Assuming the substrate and interconnects to be totally unrestrained against thermal expansion and contraction, i.e., that the interconnects are not joined to the solar cells, the changes $\Delta d_1$, $\Delta d_2$ in the center distances $d_1$, $d_2$ produced by a given temperature change $\Delta t$ are approximated by the following expressions:

$$\Delta d_1 \approx C_1 d_1 \Delta t$$

$$\Delta d_2 \approx C_2 d_2 \Delta t$$

where $C_1$, $C_2$ are the coefficients of thermal expansion of the substrate and interconnects, respectively.

It is evident that if the substrate 16 and interconnects 26 undergo differential thermal expansion and contraction, i.e., $\Delta d_1 \neq \Delta d_2$, in response to temperature changes, the interconnects will be stressed in tension or compression, as the case may be. Moreover, since in the course of most space missions, a solar array is subjected to thermal cycling, the interconnects are stressed cyclically, i.e., stressed alternately in tension and compression. As noted earlier, this cyclic stressing frequently causes fatigue failure of the interconnects.

Figure 2:
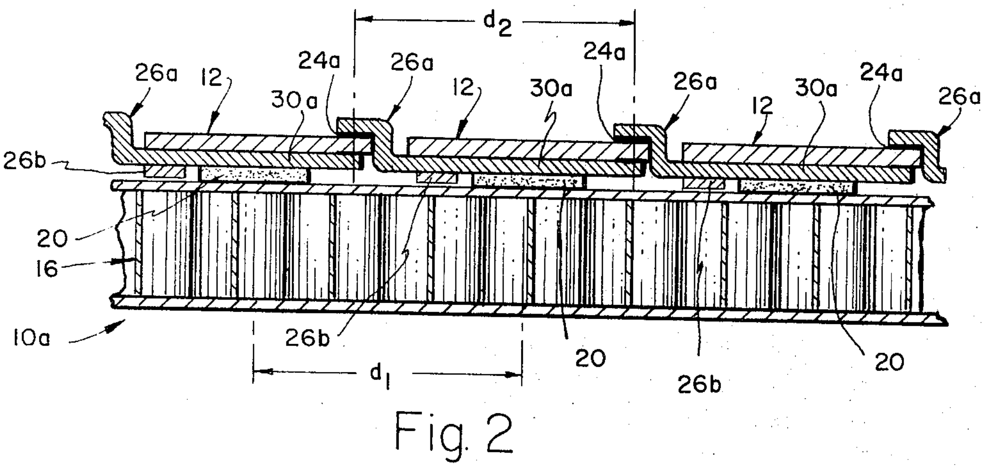
FIG. 2 is a section through a present improved solar array.
Figure 3:
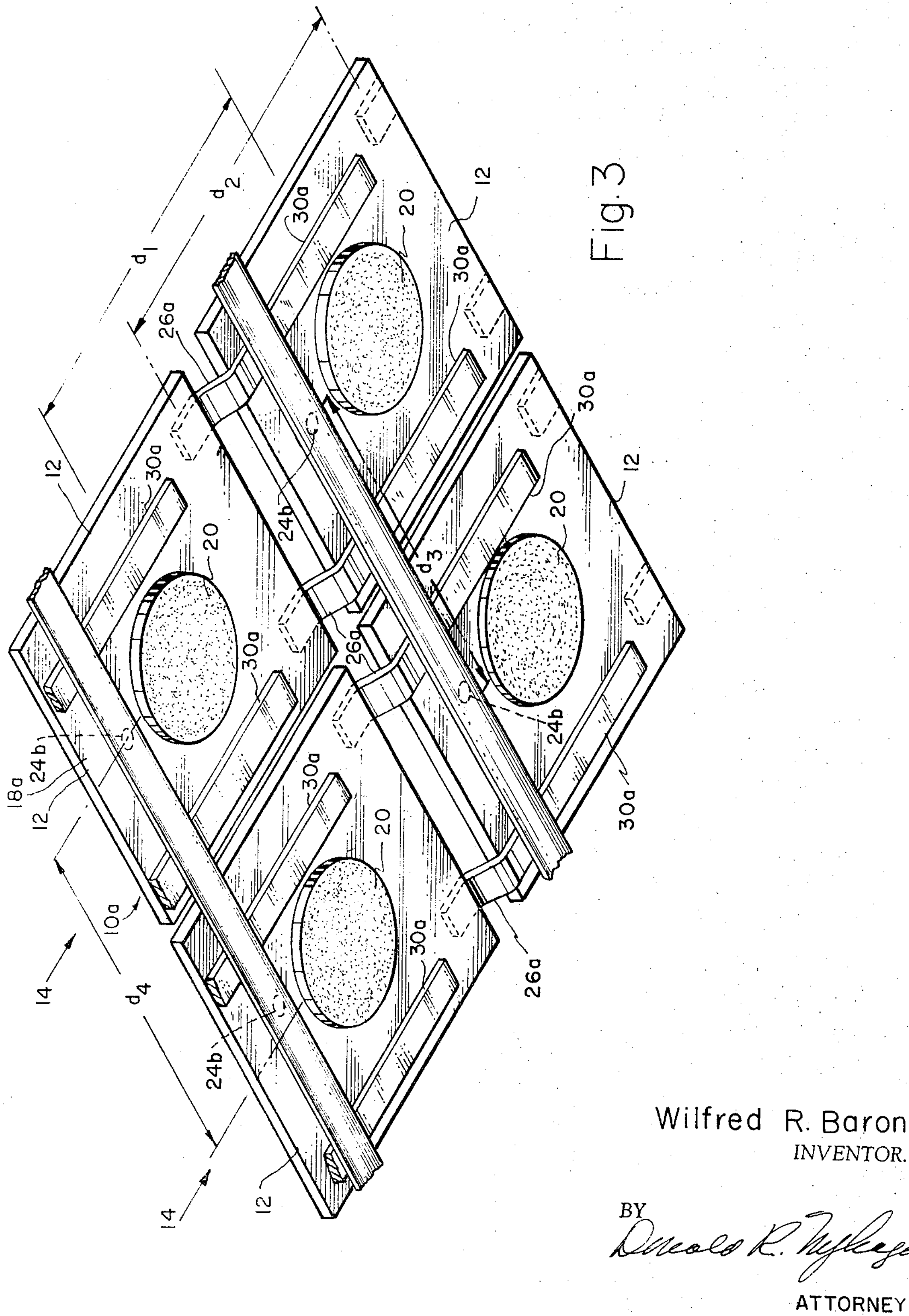
FIG. 3 is a perspective view of the underside of the solar array in FIG. 2 with the supporting substrate omitted.

Reference is now made to FIGS. 2 and 3, illustrating an improved solar array 10*a* according to the invention. This solar array is generally similar to the prior art array of FIG. 1 in that solar array 10*a* has solar cells 12 attached by silicone epoxy cement 20 to a supporting substrate 16 and electrically joined in series by interconnects 26*a* and in parallel by interconnects 26*b*. Solar array 10*a* differs from solar array 10 in that the lower terminal portions 30*a* of the interconnects 26*a* of array 10*a* are elongated to increase the center distance $d_2$ between their respective attachment points 24*a* to the adjacent solar cells 12. Further, the center distance $d_2$ between the interconnect attachment points is related to the center distance $d_1$ between the attachment points of adjacent solar cells 12 in each row 14 to the substrate 16 and to the coefficient $C_1$, $C_2$ of thermal expansion of the substrate and interconnects as follows:

$$C_1 d_1 \approx C_2 d_2$$

From this expression, it is evident that during temperature cycling of the solar array 10*a*, each interconnect 26*a* and the portion of the substrate 16 between the attachment points of the adjacent solar cells 12 to the substrate undergo substantially equal thermal expansion and contraction. As a consequence, the interconnects are not stressed nor subjected to cyclic stressing as are the interconnects in the prior art solar array of FIG. 1. Fatigue failure of the interconnects 26*a* is thereby avoided and the need for providing flexibility in the interconnects is eliminated.

Referring to FIG. 3, the parallel interconnects 26*b*, designated in FIG. 2 are flat conductor strips which, and the interconnects 26*b*, may be slotted to provide some degree of longitudinal resiliency to the strips. Interconnects 26*b* are attached at points 24*b* to the base contacts 18 of solar cells 12 in adjacent cell rows 14. The center distances $d_3$, $d_4$ between the interconnect attachment points 24*b* and the cell attachment points 20 in directions normal to the cell rows 14 and the coefficients $C_1$, $C_3$ of thermal expansion of the substrate 16 and interconnects 26*b* are related as follows:

$$C_1 d_4 \approx C_3 d_3$$

Accordingly, during thermal cycling of the array, the interconnects 26*b* and the portions of the substrate 16 between the cell attachment points 20 of adjacent cell rows undergo substantially equal thermal expansion and contraction, whereby the interconnects are not subjected to high stresses or cyclic stressing.

It will now be understood that if the substrate 16 and interconnects 26*a*, 26*b* have the same or substantially the same coefficients of thermal expansion, the solar array 10*a* will be constructed with substantially equal attachment point center distances $d_1$, $d_2$ and $d_3$, $d_4$. On the other hand, if the coefficients of the substrate and interconnects differ, the center distances between the interconnect attachment points will be selected to satisfy the expressions:

$$C_1 d_1 \approx C_2 d_2$$

$$C_1 d_4 \approx C_3 d_3$$

As noted earlier, and shown in the drawings, the substrate 16*a* is a honeycomb sandwich structure. It will be understood that the thermal coefficient $C$ in the above expression, is the effective coefficient of the overall substrate structure.

What is claimed as new in support of Letters Patent is:

1. In a solar array, the combination comprising:

a substrate;

a pair of solar cells disposed over one surface of said substrate and each having collector and base contacts;

means attaching said cells to said substrate with a given center distance between the cell-substrate attachment points;

an electrically conductive interconnect extending between and having terminal portions adjacent contacts, respectively, of said solar cells; and means attaching said interconnect terminal portions to the adjacent cell contacts with a given center distance between the cell-interconnect attachment points, and said center distances being such that $$C_1 d_1 \approx C_2 d_2$$

where:

$C_1$, $C_2$ are the coefficients of thermal expansion of the substrate and interconnect, respectively;

$d_1$, $d_2$ are the center distances between the cell-substrate and cell-interconnect attachment points, respectively to effect substantial equal thermal expansion and contraction of the interconnect and substrate within the regions between the respective attachment points thus reducing cyclic stressing and flexing of the interconnect.

2. The combination according to claim 1 wherein: said substrate and interconnect have substantially equal coefficients of thermal expansion and said center distances are approximately equal.

3. The combination according to claim 1 wherein: said substrate and interconnect have different coefficients of thermal expansion; and the center distance $d_2$ between said interconnect attachment points is such that $$d_2 \approx (C_1/C_2)\, d_1.$$

* * * * *